(12) United States Patent
Vinet et al.

(10) Patent No.: US 9,112,014 B2
(45) Date of Patent: Aug. 18, 2015

(54) TRANSISTOR WITH COUNTER-ELECTRODE CONNECTION AMALGAMATED WITH THE SOURCE/DRAIN CONTACT

(75) Inventors: Maud Vinet, Rives (FR); Qing Liu, Guilderland, NY (US)

(73) Assignees: COMMISSARIAT A L'ENERGIE ATOMIQUE ET AUX ENERGIES ALTERNATIVES, Paris (FR); STMICROELECTRONICS, INC.

( * ) Notice: Subject to any disclaimer, the term of this patent is extended or adjusted under 35 U.S.C. 154(b) by 0 days.

(21) Appl. No.: 13/812,714

(22) PCT Filed: Jul. 27, 2010

(86) PCT No.: PCT/US2010/043337
§ 371 (c)(1),
(2), (4) Date: Apr. 8, 2013

(87) PCT Pub. No.: WO2012/015393
PCT Pub. Date: Feb. 2, 2012

(65) Prior Publication Data
US 2013/0193494 A1    Aug. 1, 2013

(51) Int. Cl.
| H01L 29/76 | (2006.01) |
| H01L 29/78 | (2006.01) |
| H01L 21/74 | (2006.01) |
| H01L 21/768 | (2006.01) |
| H01L 21/8234 | (2006.01) |
| H01L 21/8238 | (2006.01) |
| H01L 21/84 | (2006.01) |
| H01L 29/417 | (2006.01) |
| H01L 29/66 | (2006.01) |
| H01L 29/786 | (2006.01) |

(52) U.S. Cl.
CPC ............. *H01L 29/78* (2013.01); *H01L 21/743* (2013.01); *H01L 21/76895* (2013.01); *H01L 21/823418* (2013.01); *H01L 21/823475* (2013.01); *H01L 21/823814* (2013.01); *H01L 21/823871* (2013.01); *H01L 21/84* (2013.01); *H01L 29/41733* (2013.01); *H01L 29/66477* (2013.01); *H01L 29/66772* (2013.01); *H01L 29/78645* (2013.01); *H01L 29/78648* (2013.01)

(58) Field of Classification Search
USPC .......... 257/288, 347, 374, 349–354; 438/517
See application file for complete search history.

(56) References Cited

U.S. PATENT DOCUMENTS

| 4,875,086 A | 10/1989 | Malhi et al. |
| 6,611,023 B1 | 8/2003 | En et al. |
| 2004/0253798 A1* | 12/2004 | Mori ............................. 438/517 |

(Continued)

FOREIGN PATENT DOCUMENTS

WO    WO 98/57379    12/1998

*Primary Examiner* — Cheung Lee
*Assistant Examiner* — Frederick B Hargrove
(74) *Attorney, Agent, or Firm* — Oliff PLC

(57) ABSTRACT

The field effect device includes an active area made from semi-conducting material and a gate electrode separated from the active area by a dielectric gate material. A counter-electrode is separated from the active area by a layer of electrically insulating material. Two source/drain contacts are arranged on the active area on each side of the gate electrode. One of the source/drain contacts is made from a single material, overspills from the active area and connects the active area with the counter-electrode. The counter-electrode contact is delineated by a closed peripheral insulating pattern.

12 Claims, 4 Drawing Sheets

(56) References Cited

U.S. PATENT DOCUMENTS

| | | |
|---|---|---|
| 2005/0214988 A1 | 9/2005 | Campbell et al. |
| 2005/0253175 A1* | 11/2005 | Taddiken ............... 257/288 |
| 2008/0128705 A1 | 6/2008 | Ishiguro |
| 2008/0182380 A1* | 7/2008 | Oka ............... 438/425 |
| 2010/0200919 A1* | 8/2010 | Kikuchi ............... 257/351 |
| 2012/0104495 A1* | 5/2012 | Zhu et al. ............... 257/347 |

* cited by examiner

TRANSISTOR WITH COUNTER-ELECTRODE CONNECTION AMALGAMATED WITH THE SOURCE/DRAIN CONTACT

BACKGROUND OF THE INVENTION

The invention relates to a field effect device comprising:
an active area made from semi-conducting material,
a gate electrode,
a counter-electrode separated from the active area by a layer of electrically insulating material,
two source/drain contacts arranged on the active area.

STATE OF THE ART

With the continuous reduction of their dimensions, active devices of integrated circuit, such as transistors, are confronted with physical phenomena which can no longer be considered to be negligible. These new physical phenomena result in disturbance effects on the major electrical characteristics of the devices, for example short-channel effect. In order to overcome a certain number of these drawbacks, different solutions are envisaged.

The substrates on which the transistors are integrated have been modified in order to reduce some of the disturbance phenomena of transistors. These improved substrates are of semi-conductor on insulator type. They are formed by a layer of semi-conducting material separated from the support substrate by a dielectric material. Depending on the thickness of the layer of semi-conducting material on which the field effect transistor is integrated, the substrate is said to be fully or partially depleted. Thus, for a fully depleted substrate, the gate electrode electrostatically controls the whole thickness of the semi-conducting material (thin semi-conducting layer), whereas for a partially depleted substrate, the gate electrode only controls the part adjacent to the gate (thicker semi-conducting layer).

By successively using substrates of partially depleted and then fully depleted semi-conductor on insulator type, the race towards miniaturization and continuous improvement of transistors has been able to be continued.

Substrates of fully depleted semi-conductor on insulator type were then modified by reducing the thickness of the dielectric material layer and integrating a doped layer in the support substrate. This doped layer is formed near to the dielectric layer to form a ground plane. This ground plane enables better control of disturbance effects inside the transistor formed on the semi-conducting material layer, in particular short-channel effect, by means of a better control of lowering of the barrier induced by the drain electrode (DIBL). However the use of a ground plane is accompanied by integration of an additional control electrode linked to the polarization of this ground plane. This results in additional constraints at fabrication method level and also as far as the surface used by the transistor is concerned.

The document U.S. Pat. No. 6,611,023 describes a field effect transistor provided with a counter-electrode, this counter-electrode being formed under the conductive channel by doping the support substrate. The counter-electrode also extends under a part of an insulating pattern coating the device to enable a remote contact connection. A connection is made between the counter-electrode and gate electrode via the insulating pattern. In this way the gate electrode and counter-electrode are electrically connected. The transistor and its fabrication method are not optimal as it is necessary to pass through the insulating pattern to achieve control of the counter-electrode. This point is problematic when working in dense circuits as the safety margins at the level of this contact connection in the insulating pattern also have to be taken into account.

OBJECT OF THE INVENTION

It is therefore sought to produce field effect devices provided with a counter-electrode and a counter-electrode contact in simple manner without a significant increase of the surface of the device. For this, it is sought in particular to produce a field effect device having a counter-electrode contact that is amalgamated with the source/drain contact.

This requirement is met by means of a device of particular configuration. The device is characterized in that one of the source/drain contacts is made from a single material, overspills from the active area and connects the active area with the counter-electrode.

The device is achieved by means of a method comprising
  providing a support substrate successively covered by a layer of electrically insulating material and a layer of semi-conducting material,
  forming an insulating pattern in the layer of semi-conducting material, in the layer of electrically insulating material and in the support substrate, the insulating pattern delineating an active area in the layer of semi-conducting material,
  forming first and second source/drain contacts, the first contact being formed on the top wall of the active area, the second contact being formed on the top wall of the active area and on the side wall of the support substrate.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
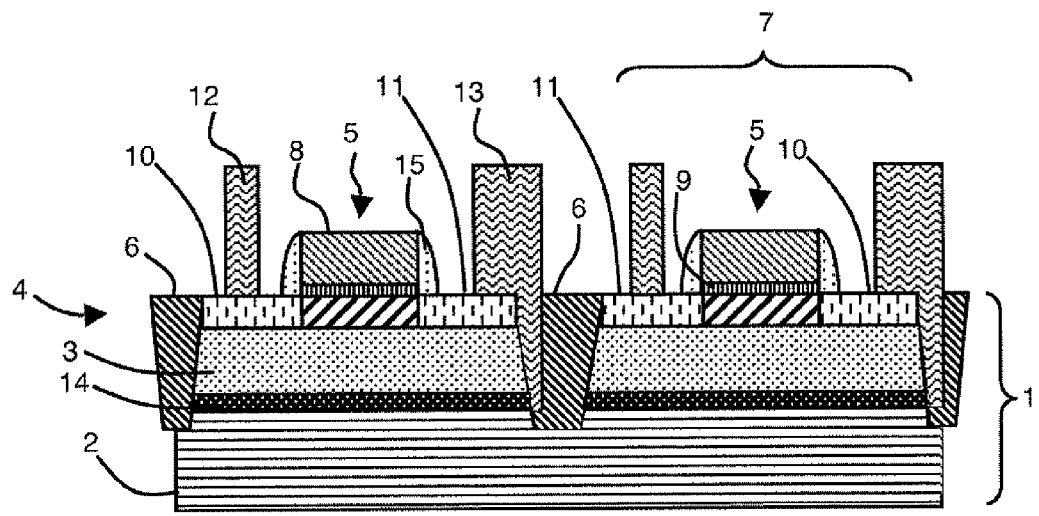
FIG. 1 schematically represents a cross-section of two transistors each provided with a source/drain contact amalgamated with a counter-electrode contact, FIG. 2 schematically represents a top view of two transistors provided with a common source/drain and counter-electrode contact, FIGS. 3 to 7 schematically represent cross-sections of the steps of a method for fabricating two transistors provided with a source/drain contact amalgamated with a counter-electrode contact, FIG. 8 schematically represents a cross-section of another embodiment of two transistors provided with a source/drain contact amalgamated with a counter-electrode contact.
Figure 3:
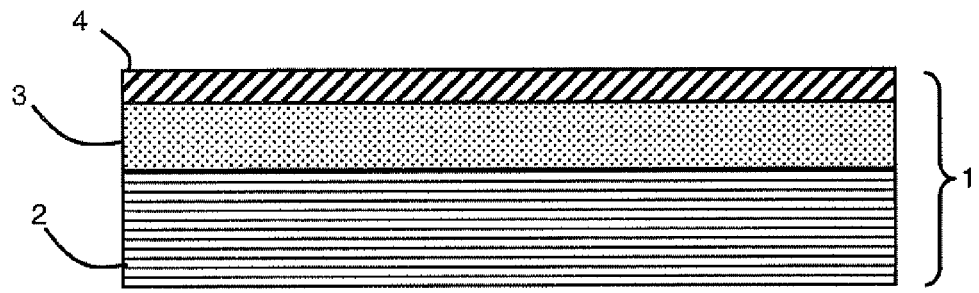

As illustrated in FIGS. 1 and 3, substrate 1 successively comprises a support substrate 2, an electrically insulating layer 3 made of dielectric material, and an active layer 4 made of semi-conducting material. Active layer 4 of semi-conducting material is patterned so as to form an active area 5 of semi-conducting material. Active area 5 is electrically insulated from support substrate 2 by electrically insulating layer 3 and from the other active areas 5 by an insulating pattern 6 or by etching of active layer 4.

Preferably, active area 5 is bordered by a closed insulating pattern 6 that surrounds active area 5. Active area 5 and insulating pattern 6 present complementary shapes.

A field effect transistor 7 is integrated on active area 5. Field effect transistor 7 comprises a gate electrode 8 separated from active layer 4 by an electrically insulating dielectric gate material 9. Transistor 7 also comprises a source electrode 10 and drain electrode 11 arranged in an active layer 4 on each side of the conductive channel. The conductive channel is formed in active layer 4 under gate electrode 8. Source electrode 10 and drain electrode 11 are therefore arranged on each side of gate electrode 8.

First and second source/drain contacts 12, 13 are arranged above source electrode 10 and drain electrode 11. First and second source/drain contacts 12, 13 are formed on the top wall of the active area by pads of electrically conductive material, preferably of a metallic material. The first and second contacts are both formed in monoblock manner by a single material (a pure chemical element or an alloy). The source/drain contacts and the gate contact are pads of conductive material placed on the associated electrode.

Field effect transistor 7 also comprises a counter-electrode 14 formed in support substrate 2. This counter-electrode 14 is for example made by doping a part of substrate 2 or by integrating an electrically conductive material such as a metallic material. Counter-electrode 14 is formed at least facing the conductive channel, but it can extend partially or completely underneath source electrode 10 and/or drain electrode 11 if necessary. The counter-electrode preferably extends underneath the source and drain areas. Counter-electrode 14 is formed for example by implantation of dopants. This implantation is preferably performed after insulating pattern 6 has been formed and before dielectric gate material 9 is formed. Definition of the counter-electrode can be achieved by means of an additional masking enabling the counter-electrode design pattern to be defined while at the same time ensuring a contact connection.

The structure of the field effect device can be presented by the following stacking: gate electrode 8, dielectric gate material 9, active area 5, layer 3 of electrically insulating material followed by counter-electrode 14. Gate electrode 8 and counter-electrode 14 are arranged on each side of active area 5.

As transistor 7 comprises an additional electrode as compared with a conventional transistor, it requires an additional contact, a counter-electrode contact enabling polarization of counter-electrode 14. This contact 13 is amalgamated with one of the source/drain contacts, for example second source/drain contact 13, so that transistor 7 comprises, in the top view illustrated in FIG. 2, a gate contact 15, a first source/drain contact 12 and a second source/drain contact 13 that is amalgamated with the counter-electrode contact.

Counter-electrode contact 13 being amalgamated with the second source/drain contact, the polarization of counter-electrode 14 is linked to that of source electrode 10 or drain electrode 11 associated with second contact 13. For reasons of clarity, only one of the source/drain contacts is mentioned, here first source/drain contact 11, and the second source/drain contact is mentioned as counter-electrode contact 13.

Counter-electrode contact 13 extends beyond the surface of active area 5, i.e. it overspills from the design of the electrode with which it is associated (in top view). Counter-electrode contact 13 provides the electrical connection between a part of the active area (one of the two source and drain electrodes) and counter-electrode 14. The counter-electrode contact has an interface with the top wall of active area 5 and an interface with the support substrate at the level of the counter-electrode. As illustrated in FIG. 1, counter-electrode contact 13 has an interface with a top wall of counter-electrode 14 which enables electrical connection between counter-electrode 14 and one of source/drain electrodes 10, 11. The counter-electrode contact can also present an interface with the side wall of active area 5 and/or the side wall of layer 3 of electrically insulating material.

Counter-electrode contact 13 is formed partially on active area 5 and outside this active area 5. Counter-electrode contact 13 comprises a first contact area with counter-electrode 14, a second contact area with active area 5 and a connection area between first and second contact areas. In the conductive pad acting as counter-electrode contact 13, the connecting area connects the first and second contact areas and is arranged outside the support substrate. The connecting area is located between first and second parallel planes, the first plane corresponding to the interface between counter-electrode 14 and layer 3 of electrically insulating material and the second plane corresponding to the top surface of the active area.

Counter-electrode contact 13 is formed partially in a gap between active area 5 and insulating pattern 6. Active area 5 and counter-electrode contact 13 are surrounded by the peripheral and closed insulating pattern 6 so that the insulating pattern forms a complementary design pattern to that formed by active area 5 and counter-electrode contact 13. Active area 5 and counter-electrode contact 13 are therefore together surrounded by insulating pattern 6.

Counter-electrode contact 13 can also be in contact with the side wall of the source/drain electrode and the side wall of electrically insulating layer 3. Counter-electrode contact 13 can then have an interface with electrically insulating layer 3 and active area 5 at the level of their lateral surfaces.

Figure 2:
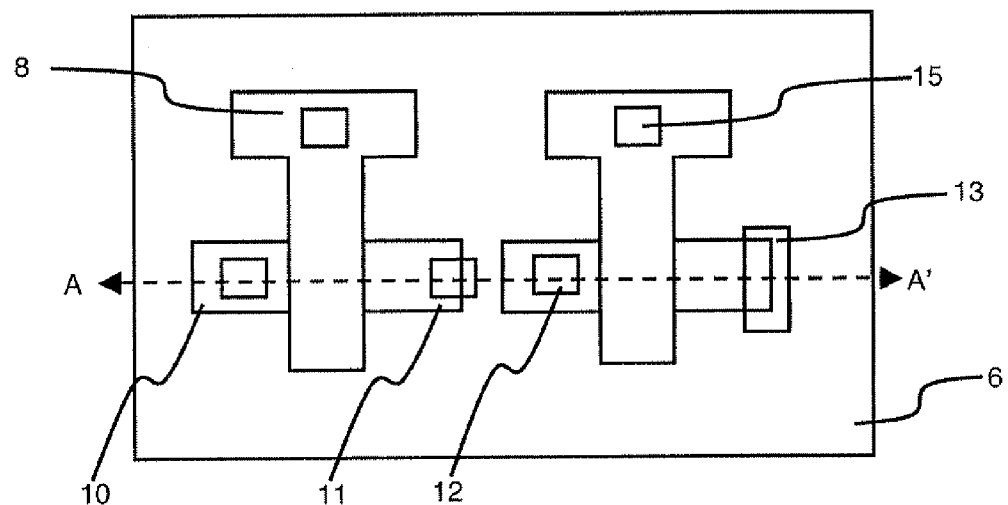

According to the design of counter-electrode contact 13, it is possible for this contact to extend over more than one lateral surface of active area 5, for example two opposite lateral surfaces of the source/drain electrode or more (right-hand transistor in FIG. 2).

Unlike an approach which performs polarization of counter-electrode 14 by means of a dedicated connected contact, a gain in compactness of the structure is obtained. There is no remote contact passing through insulating pattern 6 and/or underneath insulating pattern. Conducting pad 13 is formed directly in contact with active area 5 and counter-electrode 14 taking a direct or almost direct path which enables access resistances to be limited. Furthermore, counter-electrode contact 13 is specific to each device 7 which allows a greater freedom of operation. The counter-electrode contact is formed integrally inside a closed insulating pattern, i.e. no part of the counter-electrode contact passes under the insulating pattern to emerge at the level of another active area. Moreover, starting from counter-electrode 14, at the surface of substrate 1, i.e. at the level of the plane formed by the insulating pattern and active layer 4, contact 13 emerges at the level of a direct contact with one of the source/drain electrodes of the device.

The other source/drain contact 12 is formed in conventional manner on the top surface of the other source/drain electrode. In this way, the transistor comprises, in the top view illustrated in FIG. 2, a first source/drain contact 12, a gate contact 15 and a second source/drain contact 13 common with the counter-electrode contact. According to the safety margins used in the definition step of the future contacts, first source/drain contact 12 can also extend beyond the design of active area 5 and overspill onto insulating pattern 6. However, the first source/drain contact must not electrically connect counter-electrode 14, otherwise a short-circuit of the conductive channel by counter-electrode 14 will occur.

The device obtained does not present any significant surface increase compared with a standard device that does not comprise a counter-electrode contact. The surface of the active area is not modified compared with that of a standard device. Only the position of the second source/drain contact is offset so as to impinge on and therefore etch a part of closed insulating pattern 6 that surrounds active area 5.

Connection between counter-electrode contact 13 and counter-electrode 14 is achieved by at least one of the side surfaces of active area 5 and layer 3 thereby enabling the depression of contact 13 inside insulating pattern 6 to be limited while ensuring a high contact surface with counter-electrode 14.

Insulating pattern 6 separates active area 5 electrically from the rest of semi-conducting layer 4. Insulating pattern 6 can also be formed through electrically insulating material layer 3 and in a part of support substrate 2. Insulating pattern 6 is preferably sunk in support substrate 2 over a larger depth than that of counter-electrode 14. In this way, insulating pattern 6 also performs electrical insulation between the different counter-electrodes 14 of support substrate 2. The closed peripheral insulating pattern then delineates the surfaces of active area 5, of associated electrically insulating layer 3 and the maximum extent of counter-electrode 14. However, other insulation modes can be used, for example insulation by means of areas doped with different types of dopants.

This structure can be obtained by means of a method that is simple to implement as it does not use steps that are specific to develop. It is then possible to perform co-integration of transistors with a counter-electrode contact 13 and of transistors without a counter-electrode contact on a single substrate.

As illustrated in FIG. 3, initial substrate 1 is a substrate of semi-conductor on insulator type that comprises a support substrate 2, a layer 3 of electrically insulating material and a layer 4 of semi-conducting material.

Figure 4:
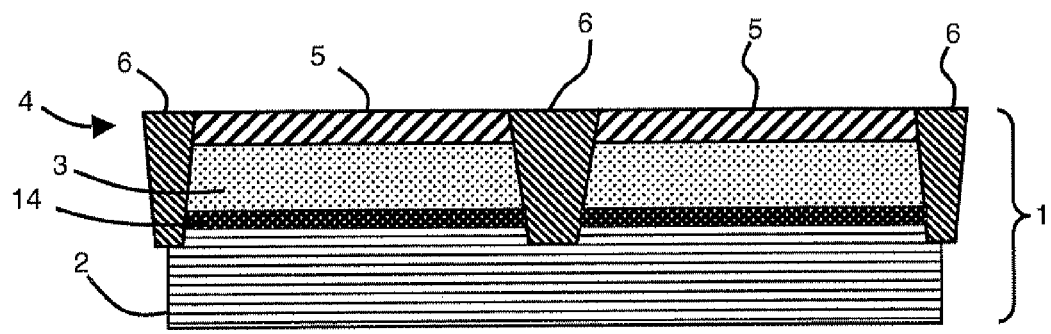

As illustrated in FIG. 4, the substrate is patterned such as to delineate active areas 5 in semi-conducting material layer 4. The void areas formed in the substrate are then filled by an insulating material so as to form insulating patterns 6.

Figure 5:
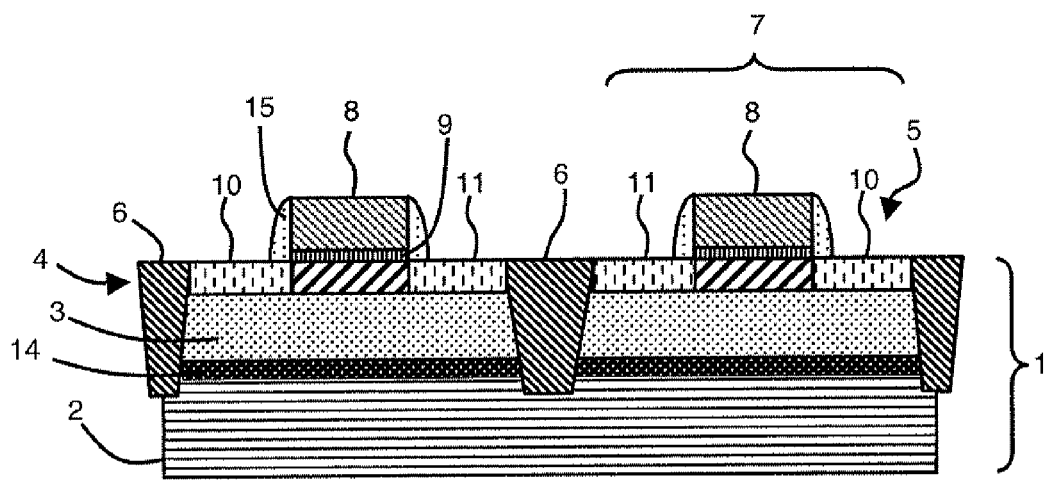
Figure 6:
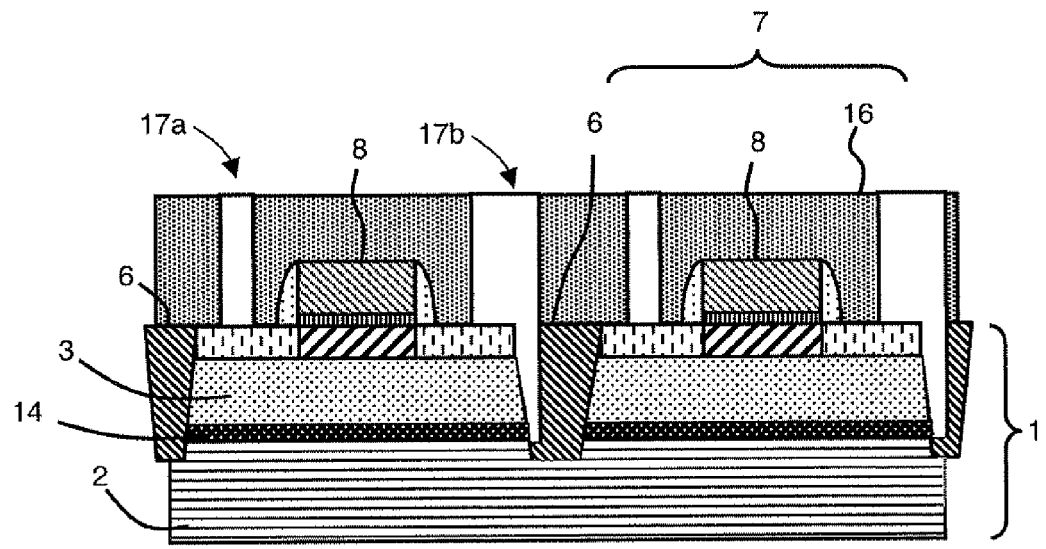
Figure 7:
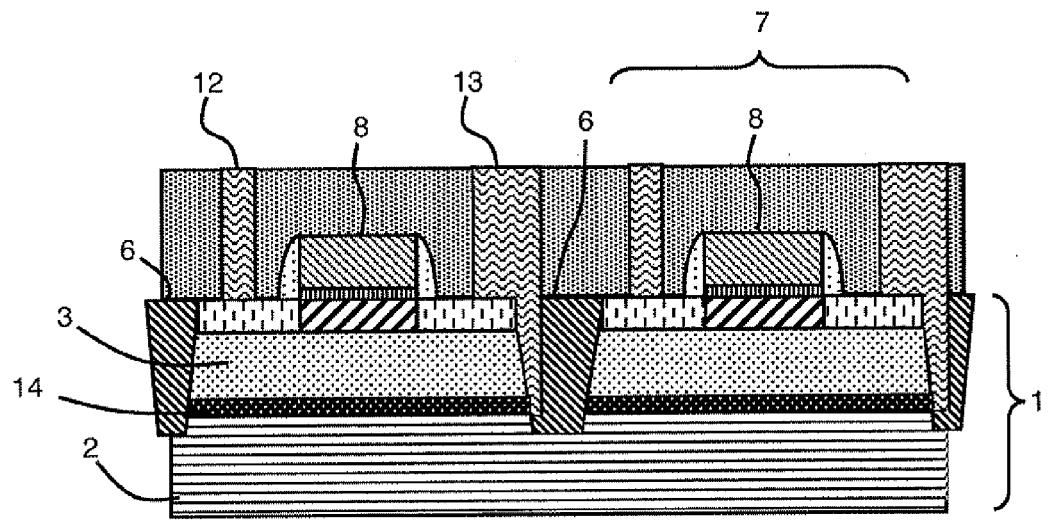

As illustrated in FIG. 5, in conventional manner, gate dielectric 9 and gate electrode 8 are formed on active area 5 so as to delineate the different electrodes of field effect device 7. In an alternative embodiment, not represented, source and drain electrodes 10, 11 are thickened compared with the thickness of semi-conducting material 4 present under gate electrode 8. This thickening is achieved for example by means of selective epitaxy of silicon, germanium or an alloy of the latter.

In conventional manner, gate electrode 8 can be electrically insulated from source and drain electrodes 10, 11 by lateral spacers 15 of variable shape and thickness.

Gate electrode 8 and source and drain electrodes 10, 11 are then covered by a covering layer 16 of electrically insulating material. Covering layer 16 is patterned such as to create void areas 17a, 17b representative of the future contacts. This patterning releases a part of the top surface of each of source/drain electrodes 10, 11. For the future second source/drain contact 13, uncovered area 17b comprises at least a part of the top area of one of the electrodes and a part of adjacent insulating pattern 6. Uncovered area 17a of future first source/drain contact 12 can be contained in the top surface of the associated electrode or it can extend beyond the electrode, typically on insulating pattern 6.

Releasing of areas 17 representative of the two future contacts 12, 13 can be achieved for example by means of an etching mask associated with anisotropic plasma etching of covering material 16.

In an alternative embodiment, to preserve a certain symmetry in operation of the device, the released surface of the electrode at the level of future counter-electrode contact 14 is at least equal to that of the contact of the other source/drain electrode. This results in the etching mask associated with releasing of the areas of source/drain contacts 12, 13 presenting different open surfaces between the two electrodes. These two open areas can present any shape. Preferably the free surface of the area representative of the first source/drain contact is smaller than that of the second source/drain contact.

For example purposes, released area 17b of future counter-electrode contact 13 can overspill onto one of the common side surfaces between insulating pattern 6 and active area 5 or onto two side surfaces (opposite or not) or onto more side surfaces. Overspill of open area 17b onto insulating pattern 6 depends on the safety margins that exist to ensure access to counter-electrode 14 while preventing short-circuiting with gate electrode 8 and an adjacent device.

For its part, released area 17a of future first source/drain contact 12 is located above the source/drain electrode, i.e. only semi-conducting material is uncovered. Insulating pattern 6 is not accessible from the open area representative of future first contact 12 (FIG. 2).

Once insulating pattern 6 has been partially uncovered in future counter-electrode contact 13, the latter is patterned by any suitable technique to release a part of the side wall of counter-electrode 14. The depth of patterning in insulating pattern 6 makes it possible to define the height of the contact to come.

Etching of insulating pattern 6 can be performed in anisotropic manner keeping the etching pattern present, for example by plasma etching. It can also envisaged to use the covering material bordering the existing void area as additional etching mask (a hard mask). It is further possible to perform etching of insulating pattern 6 by an isotropic technique, for example by wet channel or by plasma. Etching of the covering material and etching of insulating pattern 6 can be performed in a single step (on the same equipment) if the materials to be eliminated are suitable.

The etching techniques and the materials are chosen such as to limit nuisance consumption of the other materials in presence when releasing the source and drain electrodes and when releasing counter-electrode 14.

Figure 8:
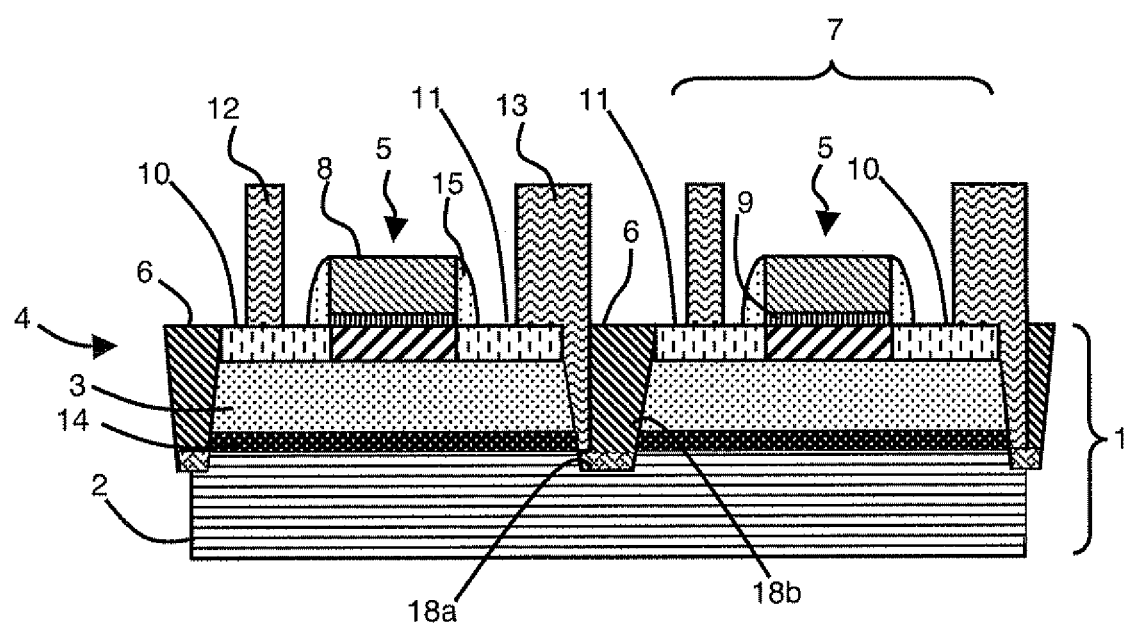

If insulating pattern 6 is composed of several different insulating materials 18, for example a first material called "core material" made from silicon oxide and a second insulating material called "coating material" made from silicon nitride or from hafnium oxide, the etching chemistries are chosen accordingly. Other materials are able to be used in this architecture. In an alternative embodiment that can be combined or not with the previous embodiment, insulating pattern 6 can also comprise different core materials. In this way, patterning stopping can be achieved by changing core material. In another alternative embodiment illustrated in FIG. 8, first 18a and second 18b insulating materials are arranged above one another without there being any coating of one of the materials by the other.

Once covering layer 16 has been patterned and the different electrodes of the device present an uncovered surface, void areas 17 of insulating pattern 6 and of covering layer 16 are filled with an electrically conducting contact material 18. This contact material 18 simultaneously forms counter-electrode contact 13 and first source/drain contact 12.

Counter-electrode contact 13 is formed partially above insulating pattern 6 as the latter is etched and the hole formed is subsequently filled in. Counter-electrode contact 13 therefore presents an interface with insulating pattern 6, an interface with counter-electrode 14 and an interface with electrically insulating layer 3. The interface between counter-electrode contact 13 and counter-electrode 14 and the interface between counter-electrode contact 13 and active area 5 are formed on the same surface of contact 13, the first surface of contact 13. The surface opposite the first surface is in direct contact with the insulating pattern.

If the position of first contact 12 is chosen such as to extend above the insulating pattern, a differentiation step has to be added to the method. This differentiation enables insulating pattern 6 not to be etched simultaneously in areas 17 representative of future first 12 and second 13 contacts.

It is possible to perform patterning of the covering material 16 simultaneously for the two future contacts and then to seal off void area 17*a* representative of first contact 12 when patterning of insulating pattern 6 is performed. It is also possible to perform two patterning steps, each step being specific to one of the future contacts.

Thus, by controlling the position of the uncovered areas at the surface of substrate 1 starting from covering material 16, it is possible to define whether an area 17 presents a portion with an insulating pattern 6 or not. This choice of positioning enables transistors with counter-electrode contact 13 and transistors without counter-electrode contact to be formed simultaneously and without adding a specific step. To prevent formation of contact 13, the two uncovered areas simply have to open out on the active area only, or the two uncovered areas simply have to be obstructed when patterning of insulating pattern 6 is performed.

In an alternative embodiment, partial elimination of layer 3 of electrically insulating material is performed to enhance the contact surface between the source/drain electrode and counter-electrode. In this case, counter-electrode contact 13 also connects the top surface of counter-electrode 14.

In another alternative embodiment, the counter-electrode contact only connects the top part of counter-electrode 14 with active area 5. In this case, patterning of insulating pattern 6 has only released the side wall of layer 3 of electrically insulating material. The side wall of counter-electrode 14 is still in contact with insulating pattern 6. Releasing of the top wall of counter-electrode 14 is obtained by patterning insulating material layer 3 from its free side surface. In the case where the material forming insulating pattern 6 reacts with the same etching chemistry as the insulating material of layer 3, it is also possible to release the side surface of counter-electrode 14.

Preferably the electrode contact with the counter-electrode takes place mostly with the side walls of the counter-electrodes as it is difficult to master the depression into the insulating pattern that presents increasingly steep side surfaces.

The covering material can be eliminated after formation of the contacts to deposit another material having more advantageous electrical properties or it can be kept. It is also possible to eliminate the covering material when finalizing the integrated circuit comprising the device to form an architecture referred to as "with air gap". It can also be envisaged to partially or totally eliminate insulating pattern 6. The device is then surrounded by a peripheral trench the bottom whereof can be formed by the support substrate or coated by the rest of the insulating material.

This architecture is particularly well-suited to a technology called UTBB which presents a thin layer 4 of semi-conducting material and a thin layer 3 of electrically insulating material. Typically, layer 4 of semi-conducting material has a thickness comprised between 2 and 30 nm and layer 3 of electrically insulating material has a thickness comprised between 5 and 50 nm. The presence of a thin buried dielectric 3 between support substrate 2 and semi-conducting material layer 4 does in fact enable a reduced access resistance to be obtained as the distance between the two electrodes is small.

For example purposes, counter-electrode contact 13 overspills from the source/drain electrode by a distance of about 3 nm for a device formed in the 22 nm technological node, however an overspill comprised between 3 and 30 nm enables technological feasibility to be ensured with good yields.

This type of transistor can be used in standard memory cells to avoid using specific circuits that perform polarization of the substrate. In a technological node called 65 nm, the polarization circuit is repeated every 30 to 40 μm and it occupies a surface equivalent to a half-cell or to three quarters of a cell. Integration of a counter-electrode connection directly within the field effect device enables this additional circuit to be eliminated and the integration diagram to be simplified by also eliminating metallic lines serving the purpose of routing. For example, the counter-electrode contact is produced at the level of the source areas of NMOS and PMOS transistors. The source areas of NMOS conduction transistors are then grounded whereas the source areas of PMOS charge transistors are connected to supply voltage Vdd. Connection of the counter-electrodes of transistors with the same type of conductivity is preferably performed by means of dopant wells.

It can also be envisaged to integrate this electric connection between one of the source and drain areas and the counter-electrode for different standard cells, for example memory cells.

For example, the field effect device provided with a counter-electrode contact amalgamated with one of the two source/drain contacts is particularly advantageous when it is integrated in a standard AND cell with four inputs. In this standard cell, the transistors whose source or drain electrode is connected to a supply voltage, high voltage Vdd or low voltage GND, have a source/drain contact amalgamated with the counter-electrode contact. It is the contact connected to one of the supply voltages of the cell that also acts as counter-electrode contact. The counter-electrode thus has an imposed potential, voltage Vdd or ground GND depending on the transistors. The other transistors of the cell do not present a counter-electrode contact. All PMOS transistors have their counter-electrode connected to voltage Vdd and all NMOS transistors have their counter-electrode grounded. Connection of the counter-electrodes of transistors with the same type of conductivity is achieved by means of a dopant well. The dopant wells are of opposite types for transistors of opposite types.

The invention claimed is:

1. Field effect device comprising:
   an active area made from semi-conducting material;
   a gate electrode,
   a counter-electrode separated from the active area by a layer of electrically insulating material,
   two source/drain contacts arranged on the active area, and
   a closed insulating pattern surrounds the active area and the counter-electrode contact,
   wherein one of the source/drain contacts is made from a single material, overspills from the active area and connects the active area with the counter-electrode to form the counter-electrode contact,
   the insulating pattern has a complementary shape to the active area and the counter-electrode contact, the insulating pattern extends down into the layer of electrically insulating material and into a support substrate over a greater depth than that of the counter-electrode, and the counter-electrode contact presents an interface with the active area and with the side wall of the counter-electrode.

2. Device according to claim 1, wherein the insulating pattern comprises first and second insulating materials.

3. Method for producing a field effect device comprising:
providing a support substrate successively covered by a layer of electrically insulating material and a layer of semi-conducting material,
forming an insulating pattern in the layer of semi-conducting material, in the layer of electrically insulating material and in the support substrate, the insulating pattern delineating an active area in the layer of semi-conducting material,
forming first and second source/drain contacts, the first contact being formed on the active area, the second contact being formed on the active area and between the active area and the insulating pattern to connect a counter-electrode of the support substrate, and
forming a counter-electrode contact integrally inside the insulating pattern so that a part of the insulating pattern covers the bottom part of the counter-electrode contact.

4. Method according to claim 3, comprising deposition and patterning of a covering material to form first and second void areas representative of the future first and second contacts and patterning of the insulating pattern to uncover a wall of the support substrate in the second void area.

5. Method according to claim 4, wherein patterning of the insulating pattern releases the side wall of the counter-electrode.

6. Method according to claim 4, wherein the covering material and the insulating pattern are patterned on the same etching equipment.

7. Method according to claim 3, comprising filling of the insulating pattern by first and second insulating materials.

8. Method according to claim 4, wherein the deposition of covering material includes depositing a layer of electrically insulated material on a gate electrode and source and drain electrodes, and
the insulating pattern has a complementary shape to the active area during the deposition.

9. Device according to claim 1, wherein the counter-electrode contact is formed integrally inside the insulating pattern so that a part of the insulating pattern covers the bottom part of the counter-electrode contact.

10. A semi-conductor device comprising a plurality of field effect devices according to claim 1 on the same support substrate, wherein the counter-electrode contacts are electrically decoupled.

11. Method according to claim 3, wherein the steps are successive.

12. Field effect device comprising:
an active area made from semi-conducting material;
a gate electrode,
a counter-electrode separated from the active area by a layer of electrically insulating material,
two source/drain contacts arranged on the active area, and
a closed insulating pattern surrounds the active area and a counter-electrode contact,
wherein one of the source/drain contacts is made from a single material, overspills from the active area and connects the active area with the counter-electrode to form the counter-electrode contact,
the insulating pattern has a complementary shape to the active area and the counter-electrode contact,
the insulating pattern extends down into the layer of electrically insulating material and into a support substrate over a greater depth than that of the counter-electrode, and
the counter-electrode contact is formed integrally inside the insulating pattern so that a part of the insulating pattern covers the bottom part of the counter-electrode contact.

* * * * *